United States Patent
Hsu et al.

(10) Patent No.: US 9,099,990 B2
(45) Date of Patent: *Aug. 4, 2015

(54) HIGH SPEED COMMUNICATION INTERFACE WITH AN ADAPTIVE SWING DRIVER TO REDUCE POWER CONSUMPTION

(71) Applicant: Taiwan Semiconductor Manufacturing Co., Ltd., Hsin-Chu (TW)

(72) Inventors: Ying-Yu Hsu, Hsinchu (TW); Yung-Chow Peng, Hsinchu (TW); Min-Shueh Yuan, Taipei (TW); Chih-Hsien Chang, New Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 206 days.

This patent is subject to a terminal disclaimer.

(21) Appl. No.: 13/792,257

(22) Filed: Mar. 11, 2013

(65) Prior Publication Data

US 2013/0207694 A1 Aug. 15, 2013

Related U.S. Application Data

(63) Continuation of application No. 13/372,978, filed on Feb. 14, 2012, now Pat. No. 8,410,818.

(51) Int. Cl.
*H03K 19/094* (2006.01)
*H03K 3/012* (2006.01)
*H03K 19/00* (2006.01)
*H03K 19/0185* (2006.01)

(52) U.S. Cl.
CPC ............ *H03K 3/012* (2013.01); *H03K 19/0013* (2013.01); *H03K 19/018521* (2013.01)

(58) Field of Classification Search
CPC .................... H03K 19/012; H03K 19/0013
USPC .......................................... 326/26, 27, 83, 87
See application file for complete search history.

(56) References Cited

U.S. PATENT DOCUMENTS

| | | | |
|---|---|---|---|
| 6,393,062 B1 | 5/2002 | Furman et al. | |
| 7,215,144 B2 | 5/2007 | Mitby et al. | |
| 7,307,447 B2 | 12/2007 | Clements et al. | |
| 7,391,238 B2 | 6/2008 | Kim et al. | |
| 2002/0118042 A1 | 8/2002 | Helt et al. | |
| 2006/0255829 A1 | 11/2006 | Kim et al. | |
| 2007/0075745 A1 | 4/2007 | Song et al. | |
| 2007/0103186 A1* | 5/2007 | Clements et al. | 326/30 |
| 2012/0182043 A1 | 7/2012 | Dang et al. | |

* cited by examiner

*Primary Examiner* — Don Le
(74) *Attorney, Agent, or Firm* — Duane Morris LLP

(57) ABSTRACT

A high-speed bus interface with an adaptive swing driver. A high speed interface includes a transmitter and a receiver coupled via a bus. The transmitter has an adaptive swing driver and a voltage-regulating-module (VRM). The adaptive swing driver includes a post-driver and a pre-driver. The post-driver provides an adaptive swing output with a dedicated adaptive voltage power supply (VDDQ) and transition emphasis driving capacity with an internal logic voltage supply (VDD). The pre-driver provides the transition emphasis driving capacity with a pull-up and a pull-down signal path to the post-driver. The voltage-regulating-module is configured to supply signal to the adaptive swing driver. The receiver includes a comparator and a bit-error-rate detector. The comparator amplifies the adaptive swing output received from the transmitter via a bus, while the bit-error-rate detector diagnoses the amplified adaptive swing output received from the comparator.

20 Claims, 4 Drawing Sheets

HIGH SPEED COMMUNICATION INTERFACE WITH AN ADAPTIVE SWING DRIVER TO REDUCE POWER CONSUMPTION

CROSS-REFERENCE TO RELATED APPLICATIONS

This application is a continuation of application Ser. No. 13/372,978, filed 14 Feb. 2012, which is incorporated by reference in its entirety herein.

BACKGROUND

1. Technical Field

Aspects of the present disclosure relate in general to computer architecture and electronic circuitry. In particular, aspects of the disclosure include a high-speed communication bus interface with an adaptive swing driver to reduce power consumption.

2. Description of the Related Art

As microprocessors computer memory, communications interfaces and other devices increase in speed, the connections between these discrete devices, via a high-speed communication bus also must increase in speed and throughput. As with most components, for high speed parallel bus transmission, power consumption and transition time are the major concerns. With wide parallel bus transmission, the power summation of each signal unit is large and the transmission speed limited by transition time. A faster transition time results in higher transmission speeds.

As integrated circuit (IC) density increases, such as with 2.5-dimensional (2.5 D) or 3-dimensional (3D) integrated circuit processes, the amount of pins in a parallel data bus increases from tens to thousands of pins. The greater the data bus transitions, the more power the data bus consumes.

In current designs, parallel data busses use a termination scheme to limit signal swing for high speed transitions. However this termination scheme consumes high direct current (DC) power. With the advent of 2.5 D or 3D integrated circuit parallel busses, the power consumption is even higher.

In yet another current parallel data bus design, the parallel data bus uses full swing signals with a normal level power supply to get slight DC power consumption. As expected, this results in large signal swings with great transition times, thus limiting the transmission speed.

SUMMARY

A high speed interface comprising a transmitter and a receiver coupled via a bus.

The transmitter has an adaptive swing driver and a voltage-regulating-module (VRM). The adaptive swing driver includes a post-driver and a pre-driver. The post-driver is configured to provide an adaptive swing output with a dedicated adaptive voltage power supply (VDDQ) and transition emphasis driving capacity with an internal logic voltage supply (VDD). The pre-driver is configured to provide the transition emphasis driving capacity with a pull-up and a pull-down signal path to the post-driver. The voltage-regulating-module is configured to supply signal to the adaptive swing driver.

The receiver comprises a comparator and a bit-error-rate detector. The comparator amplifies the adaptive swing output received from the transmitter via a bus, while the bit-error-rate detector diagnoses the amplified adaptive swing output received from the comparator.

DETAILED DESCRIPTION

Figure 1:
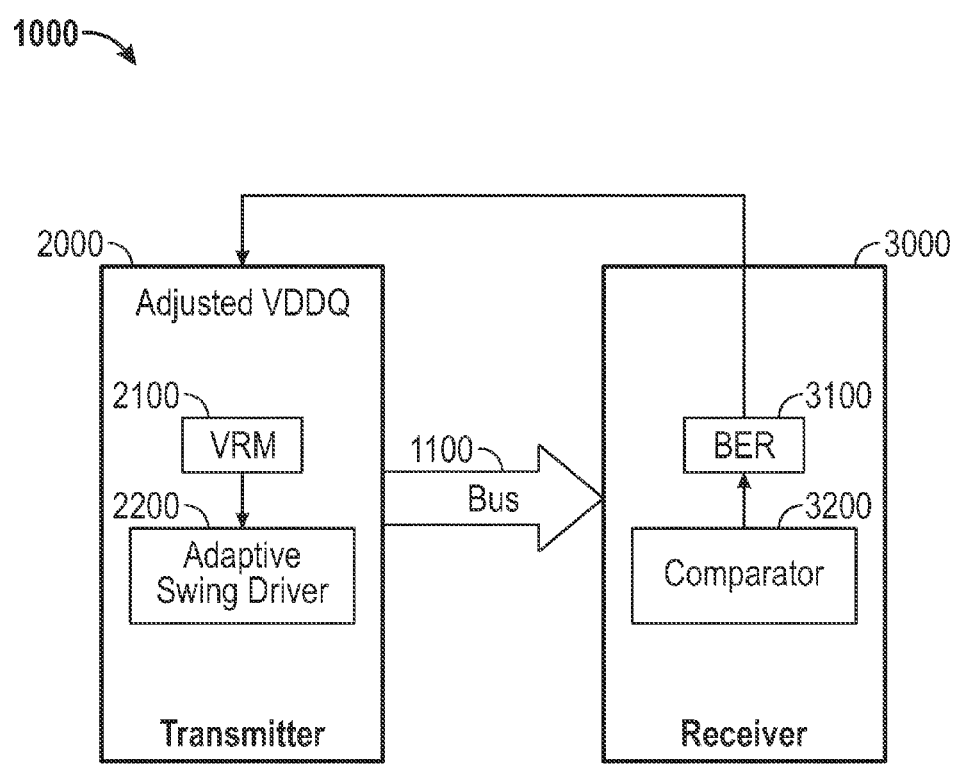
FIG. 1 depicts a high-speed interface system embodiment.

One aspect of the present disclosure includes a high-speed bus interface with an adaptive swing driver. The peripherals attached to the high-speed bus have a parallel transmitter with an adaptive swing driver and a programmable voltage-regulating-module (VRM) to supply the adaptive swing driver. Similarly, each peripheral has a receiver; the receiver includes a comparator to amplify the adaptive swing signal, and a bit-error-rate (BER) detector.

The following embodiments are described in a plurality of sections. Further, circuit elements making up each of functional blocks of the following embodiments are formed on a semiconductor substrate made of a single crystal silicon by use of the known integrated circuit (integrated circuit) technology for complementary metal oxide semiconductors transistors. With the present embodiments, a MOSFET (Metal Oxide Semiconductor Field Effect Transistor) (abbreviated to MOS transistor) is used as an example of a Metal Insulator Semiconductor Field Effect Transistor (MISFET). However, a non-oxide film is not precluded as a gate insulating film. In the drawings, a symbol O is affixed to a p-channel MOS transistor (PMOS transistor or "p-type" transistor) to be thereby differentiated from an n-channel MOS transistor (NMOS transistor or "n-type" transistor). Further, in the drawings, connection of a substrate potential of a MOS transistor is not specifically shown, however, there is no particular limitation to a connection method thereof if the MOS transistor is present in a normally operable range.

Embodiments of the invention will be described hereinafter with reference to the drawings. In all the drawings for use describing the embodiments, identical members are in principle denoted by like reference numerals, thereby omitting detailed description thereof.

Let us now turn to an embodiment of a high-speed bus interface system 1000 shown in FIG. 1, constructed and operative in accordance with an embodiment of the current disclosure. As shown in FIG. 1, high-speed bus interface system 1000 may comprise a transmitter 2000 coupled to a receiver 3000 by a bus 1100.

Transmitter 2000, configured to use an adaptive swing driver scheme, further comprises a programmable Voltage-Regulating-Module (VRM) 2100 and an adaptive swing driver 2200.

Receiver 3000 may further comprise a Bit-Error-Rate (BER) detector 3100 and a comparator 3200. Comparator 3200 is configured to amplify an adaptive swing signal received from the adaptive swing driver 2200 via bus 1100. Bit-Error-Rate detector 3100 is configured to diagnosis the output of comparator 3200 to generate a signal to control the Voltage-Regulating-Module 2100.

Bus 1100 may be a parallel bus.

Figure 2:
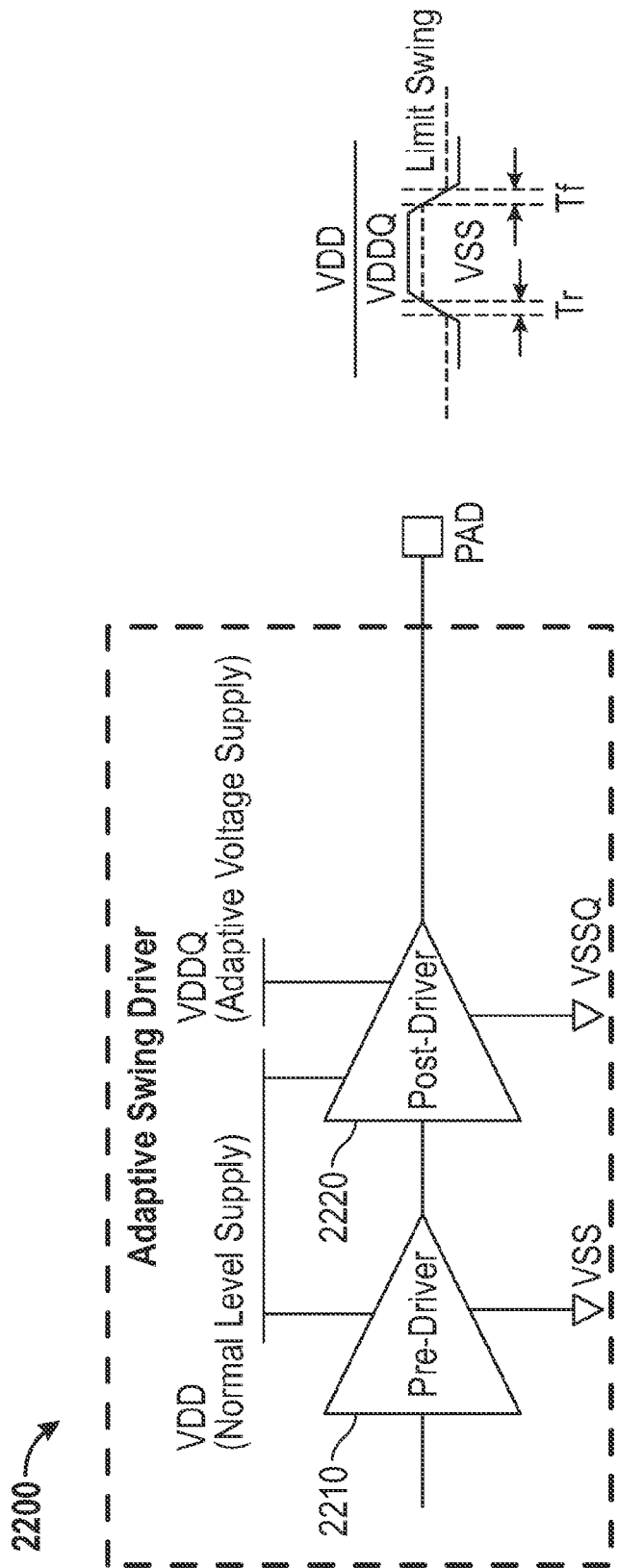
FIG. 2 illustrates an adaptive swing driver for use in a transmitter embodiment of a high-speed interface system.

FIG. 2 illustrates a block diagram for an adaptive swing driver for use in a transmitter embodiment of a high-speed interface system, constructed and operative in accordance with an embodiment of the current disclosure.

As depicted in FIG. 2, an adaptive swing driver 2200 further comprises a pre-driver 2210 and a post-driver 2220.

Post-driver 2220 is configured to provide an adaptive swing output with dedicated an adaptive voltage power supply VDDQ, and also has an emphasis driving capacity with an internal logic level voltage power supply VDD. It is understood by those practiced in the art that adaptive voltage supply VDDQ is smaller than the internal logic level voltage power supply VDD. Consequently, the adaptive swing output will a little larger than VDDQ, and the swing maximum will depend on the divide voltage of the pull-up paths.

Pre-driver 2210 is configured to provide a non-overlap pull up and down signal path with digital control driving to post-driver 2220. Furthermore, pre-driver 2210 provides a transition emphasis with pull up and down signal path to post-driver 2220.

Figure 3:
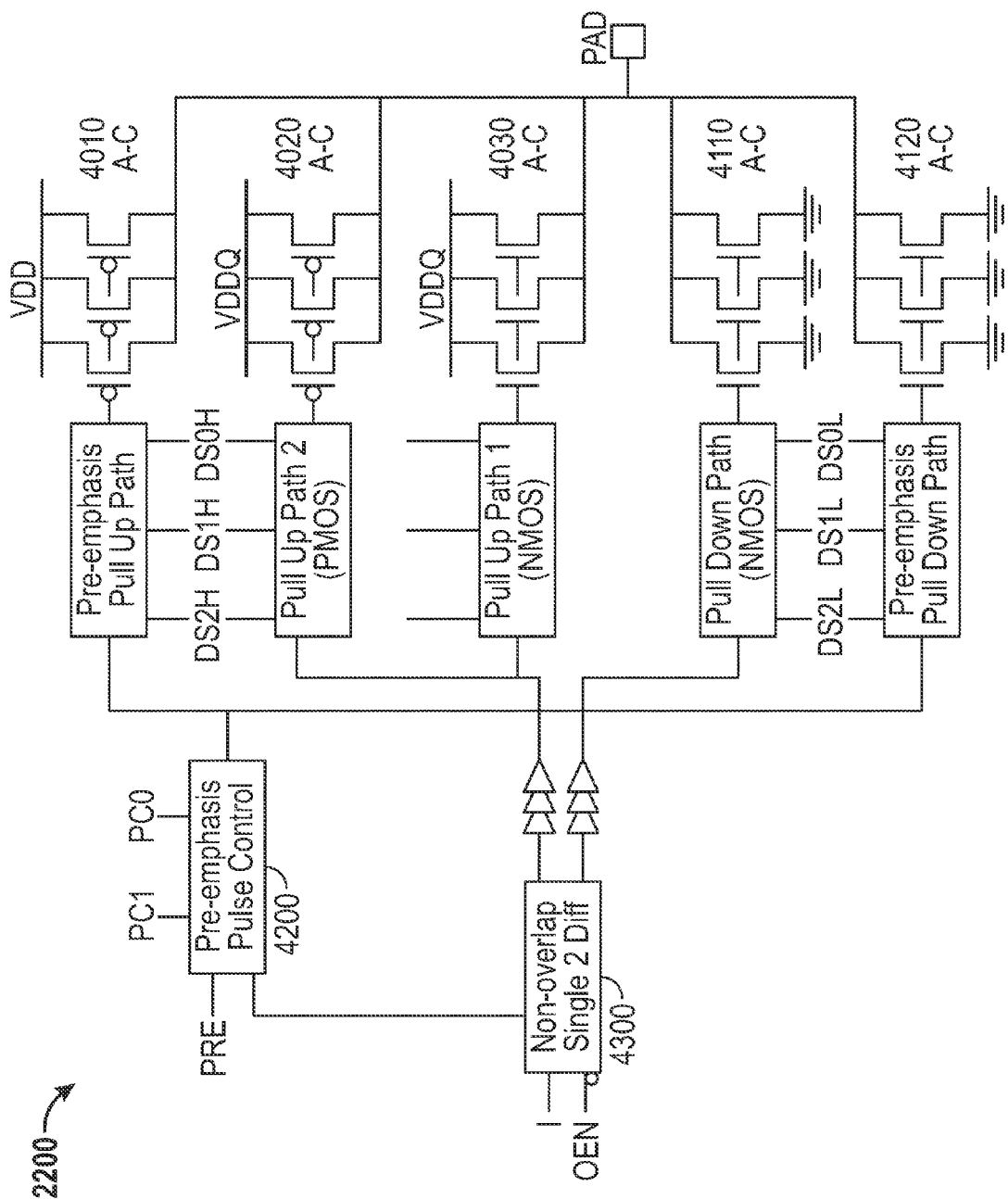
FIG. 3 is an embodiment of an adaptive swing driver for use in a transmitter embodiment of a high-speed interface system.

FIG. 3 is an embodiment of an adaptive swing driver for use in a transmitter embodiment of a high-speed interface system, constructed and operative in accordance with an embodiment of the current disclosure.

An adaptive swing post-driver 2220 embodiment of FIG. 3 comprises a pre-emphasis pull up path 4010, an NMOS pull-up path 4030, a PMOS pull-up path 4020, an NMOS pull-down path 4110, and a pre-emphasis pull-down path 4120.

As shown in FIG. 3, pre-emphasis pull up path comprises PMOS transistors 4010A-C connected to internal logic level voltage power supply VDD. It is understood, by those familiar with the art that any integer number of PMOS transistors 4010 may be used, depending upon the physical circuit layout.

PMOS pull-up path 4020 comprises a plurality of PMOS transistors 4020A-C connected to adaptive voltage power supply VDDQ. It is understood, by those familiar with the art that any integer number of PMOS transistors 4020 may be used, depending upon the physical circuit layout.

NMOS pull-down path 4110 comprises a plurality of NMOS transistors 4110A-C connected to ground (VSS). It is understood, by those familiar with the art that any integer number of NMOS transistors 4110 may be used, depending upon the physical circuit layout.

NMOS pull-up path 4030 comprises a plurality of NMOS transistors 4030A-C connected to adaptive voltage power supply VDDQ. It is understood, by those familiar with the art that any integer number of NMOS transistors 4030 may be used, depending upon the physical circuit layout.

Pre-emphasis pull-down path 4120 comprises a plurality of NMOS transistors 4120A-C connected to ground (VSS). It is understood, by those familiar with the art that any integer number of PMOS transistors 4120 may be used, depending upon the physical circuit layout.

In some embodiments, adaptive swing pre-driver 2210 may also comprise pre-emphasis pulse control 4200 and non-overlap single to differential signal path 4300. In such embodiments, pre-emphasis pulse control 4200 may be configured to control pre-emphasis pull-up path 4010 and pre-emphasis pull-down path 4120. Similarly, non-overlap single to differential signal path 4300 may control NMOS pull-up path 4030, a PMOS pull-up path 4020, and NMOS pull-down path 4110.

Figure 4:
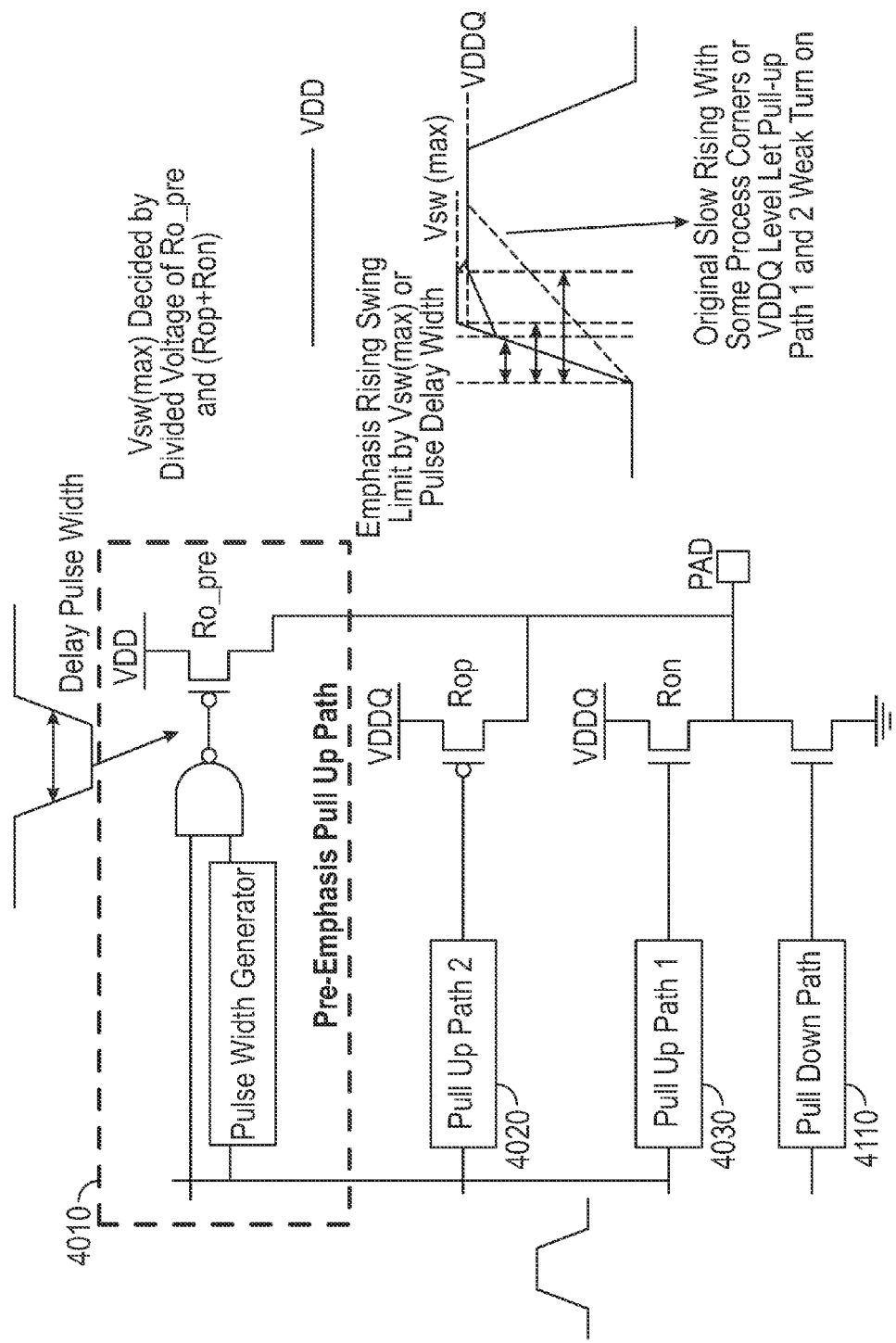
FIG. 4 illustrates the rising operation of a pre-emphasis driver for use in a transmitter embodiment of a high-speed interface system.

Moving on to FIG. 4, FIG. 4 illustrates the rising operation of a pre-emphasis driver for use in a transmitter embodiment of a high-speed interface system, constructed and operative in accordance with an embodiment of the current disclosure.

It is understood by those familiar with the art that FIG. 4 depicts a portion of adaptive swing driver 2200. In this embodiment, adaptive swing driver 2200 utilizes a pre-driver with non-overlap pull up and down signal scheme. The process uses a non-overlap single-to-differential signal path and a pull-up-and-down signal path with separate digital control driving strength.

The pre-driver 2210 has a pull up signal transition detection block and a pull down signal transition detect block. Pull up signal transition detection block provides pre-emphasis pull up pulse to a post-driver 2220, while pull down signal transition detect block provides pre-emphasis pull down pulse to the post-drive.

The previous description of the embodiments is provided to enable any person skilled in the art to practice the invention. The various modifications to these embodiments will be readily apparent to those skilled in the art, and the generic principles defined herein may be applied to other embodiments without the use of inventive faculty. Thus, the current disclosure is not intended to be limited to the embodiments shown herein, but is to be accorded the widest scope consistent with the principles and novel features disclosed herein.

We claim:

1. A high speed interface, comprising:
   a transmitter comprising:
   an adaptive swing driver with a post-driver and a pre-driver, the post-driver configured to provide an output with an adaptive voltage power supply (VDDQ) and transition emphasis driving capacity with a logic voltage supply (VDD), the pre-driver configured to provide the transition emphasis driving capacity with a pull-up and a pull-down signal path to the post-driver; and
   a voltage-regulating-module (VRM) configured to supply signal to the adaptive swing driver;
   a receiver coupled to the transmitter via a bus.

2. The high speed interface of claim 1, the post-driver comprising:
   a first number of NMOS transistors coupled to ground (VSS) to pull-down the output.

3. The high speed interface of claim 2, the post-driver further comprising:
   a second number of NMOS transistors coupled to ground to emphasize pull-down of the output.

4. The high speed interface of claim 3, the post-driver further comprising:
   a third number of NMOS transistors coupled to the adaptive voltage power supply to pull-up the output.

5. The high speed interface of claim 4, the post-driver further comprising:
   a first number of PMOS transistors coupled to the adaptive voltage power supply to pull-up output.

6. The high speed interface of claim 5, the post-driver further comprising:
   a second number of PMOS transistors coupled to the internal logic level voltage power supply to emphasize pull-up of the output.

7. The high speed interface of claim 6, the pre-driver comprising:
   a non-overlap signal to differential signal path.

8. The high speed interface of claim 7, the pre-driver further comprising:
   a pull-up signal transition detect block configured to provide pre-emphasis pull up pulse to the post-driver.

9. The high speed interface of claim 8, the pre-driver further comprising:

a pull-down signal transition detect block configured to provide pre-emphasis pull-down pulse to the post-driver.

10. The high speed interface of claim 1, the receiver comprising a comparator configured to amplify the output received from the transmitter via the bus.

11. The high speed interface of claim 10, wherein the receiver further comprise a bit error rate detector configured to diagnose the amplified output from the comparator.

12. A transmitter circuit coupled to a bus, the transmitter comprising:
   an adaptive swing driver with a post-driver and a pre-driver, the post-driver configured to provide an output with an adaptive voltage power supply (VDDQ) and transition emphasis driving capacity with a logic voltage supply (VDD), the pre-driver configured to provide the transition emphasis driving capacity with a pull-up and a pull-down signal path to the post-driver; and
   a voltage-regulating-module (VRM) configured to supply signal to the adaptive swing driver.

13. The transmitter circuit of claim 12, the post-driver comprising:
   a first number of NMOS transistors coupled to ground (VSS) to pull-down the output.

14. The transmitter circuit of claim 13, the post-driver further comprising:
   a second number of NMOS transistors coupled to ground to emphasize pull-down of the output.

15. The transmitter circuit of claim 14, the post-driver further comprising:
   a third number of NMOS transistors coupled to the adaptive voltage power supply to pull-up the output.

16. The transmitter circuit of claim 15, the post-driver further comprising:
   a first number of PMOS transistors coupled to the adaptive voltage power supply to pull-up the output.

17. The transmitter circuit of claim 16, the post-driver further comprising:
   a second number of PMOS transistors coupled to the internal logic level voltage power supply to emphasize pull-up of the output.

18. The transmitter circuit of claim 17, the pre-driver comprising:
   a non-overlap signal to differential signal path.

19. The transmitter circuit of claim 18, the pre-driver further comprising:
   a pull-up signal transition detect block configured to provide pre-emphasis pull up pulse to the post-driver.

20. A transmitter circuit, the transmitter comprising:
   a driver with a post-driver and a pre-driver, the post-driver configured to provide an output with an adaptive voltage power supply (VDDQ) and transition emphasis driving capacity with a logic voltage supply (VDD), the pre-driver configured to provide the transition emphasis driving capacity with a pull-up and a pull-down signal path to the post-driver; and
   a voltage-regulating-module (VRM) configured to supply signal to the driver.

\* \* \* \* \*